United States Patent [19]
Jost et al.

[11] Patent Number: 5,821,140
[45] Date of Patent: Oct. 13, 1998

[54] METHOD OF FORMING A BIT LINE OVER CAPACITOR ARRAY OF MEMORY CELLS AND AN ARRAY OF BIT LINE OVER CAPACITOR ARRAY OF MEMORY CELLS

[75] Inventors: Mark Jost, Boise; Charles H. Dennison, Meridian; Kunal Parekh, Boise, all of Id.

[73] Assignee: Micron Technology, Inc., Boise, Id.

[21] Appl. No.: 732,067

[22] Filed: Oct. 16, 1996

Related U.S. Application Data

[60] Continuation of Ser. No. 700,320, Aug. 7, 1996, which is a division of Ser. No. 394,545, Feb. 22, 1995, Pat. No. 5,563,089, which is a continuation-in-part of Ser. No. 277,916, Jul. 20, 1994, Pat. No. 5,401,681, which is a continuation-in-part of Ser. No. 47,668, Apr. 14, 1993, Pat. No. 5,338,700, which is a continuation-in-part of Ser. No. 17,067, Feb. 12, 1993, Pat. No. 5,340,763.

[51] Int. Cl.$^6$ .............................................. H01L 71/8242
[52] U.S. Cl. ........................... 438/241; 438/243; 438/252
[58] Field of Search ................... 437/45, 52, 60, 437/919; 438/241, 243, 252, 253, 259

[56] References Cited

U.S. PATENT DOCUMENTS

| | | | |
|---|---|---|---|
| 4,833,519 | 5/1989 | Kawano et al. | 437/190 |
| 5,006,481 | 4/1991 | Chan et al. | 437/47 |
| 5,037,773 | 8/1991 | Lee et al. | 438/255 |
| 5,049,517 | 9/1991 | Liu et al. | 438/255 |
| 5,084,405 | 1/1992 | Fazan et al. | 437/47 |
| 5,118,640 | 6/1992 | Fujii et al. | 437/60 |
| 5,126,916 | 6/1992 | Tseng | 437/60 |
| 5,155,056 | 10/1992 | Jeong-Gyoo | 437/919 |
| 5,162,248 | 11/1992 | Dennison et al. | 437/60 |
| 5,185,282 | 2/1993 | Lee et al. | 437/52 |
| 5,229,314 | 7/1993 | Okudaira et al. | 437/60 |
| 5,290,729 | 3/1994 | Hayashide et al. | 438/255 |
| 5,338,700 | 8/1994 | Dennison et al. | 437/60 |
| 5,401,681 | 3/1995 | Dennison | 437/60 |
| 5,409,855 | 4/1995 | Jun | 438/254 |
| 5,414,302 | 5/1995 | Shin et al. | 257/752 |
| 5,472,912 | 12/1995 | Miller | 437/194 |
| 5,479,053 | 12/1995 | Oda | 257/773 |
| 5,489,546 | 2/1996 | Ahmad et al. | 438/241 |

(List continued on next page.)

FOREIGN PATENT DOCUMENTS

| | | | |
|---|---|---|---|
| 0-439-965-A2 | 12/1990 | European Pat. Off. | 27/108 |
| 0-439-965-A3 | 12/1990 | European Pat. Off. | 27/108 |
| 64-41262 | 5/1989 | Japan | 27/10 |
| 02260454 | 1/1991 | Japan | 27/108 |
| 3-38061 | 4/1991 | Japan | 27/108 |
| 3-76159 | 4/1991 | Japan | 27/108 |
| 3-82155 | 4/1991 | Japan | 27/108 |
| 4-99375 | 3/1992 | Japan | 27/108 |

OTHER PUBLICATIONS

IBM Technical Disclosure Bulletin, "Method For Making Verical Coaxial Wiring", vol. 32, No. 12, May 1990, pp. 443–444.

Primary Examiner—John Niebling
Assistant Examiner—Michael S. Lebentritt
Attorney, Agent, or Firm—Wells, St. John, Roberts, Gregory & Matkin, P.S.

[57] ABSTRACT

A semiconductor memory device includes, a) a semiconductor substrate; b) a field effect transistor gate positioned outwardly of the semiconductor substrate; c) opposing active areas formed within the semiconductor substrate on opposing sides of the gate; d) a capacitor electrically connected with one of the active areas; e) a bit line; f) a dielectric insulating layer positioned intermediate the bit line and the active areas; g) a bit line plug extending through the insulating layer and electrically interconnecting the bit line with the other active area, the bit line plug comprising an electrically conductive annular ring. Integrated circuitry, beyond memory devices, utilizing an annular interconnection ring are also disclosed. Such constructions having additional radially inward insulating annular rings and conductive rings are also disclosed. A method of forming a bit line over capacitor array of memory cells having such rings is also disclosed.

9 Claims, 13 Drawing Sheets

U.S. PATENT DOCUMENTS

| | | | |
|---|---|---|---|
| 5,498,562 | 3/1996 | Dennison et al. | 437/60 |
| 5,502,335 | 3/1996 | Oda | 257/751 |
| 5,563,089 | 10/1996 | Jost et al. | 437/60 |
| 5,565,372 | 10/1996 | Kim | 438/253 |
| 5,578,872 | 11/1996 | Chen et al. | 257/915 |
| 5,580,811 | 12/1996 | Kim | 438/253 |
| 5,582,971 | 12/1996 | Chen et al. | 437/190 |
| 5,612,241 | 3/1997 | Arima | 438/241 |

# 5,821,140

METHOD OF FORMING A BIT LINE OVER CAPACITOR ARRAY OF MEMORY CELLS AND AN ARRAY OF BIT LINE OVER CAPACITOR ARRAY OF MEMORY CELLS

RELATED PATENT DATA

This patent resulted from a continuation application of U.S. patent application Ser. No. 08/700,320, filed Aug. 07, 1996 entitled "Method of Forming a Bit Line Over Capacitor Array of Memory Cells and an Array of Bit Line Over Capacitor Array of Memory Cells" listing the inventors as Mark Jost, Charles Dennison and Kunal Parekh; which is a divisional of 08/394,545, filed on Feb. 22, 1995, now U.S. Pat. No. 5,563,089 entitled "Method of Forming a Bit Line Over Capacitor Array of Memory Cells and an Array of Bit Line Over Capacitor Array of Memory Cells" listing the inventors as Mark Jost, Charles Dennison and Kunal Parekh; which is a continuation-in-part patent application of U.S. patent application Ser. No. 08/277,916, filed on Jul. 20, 1994, now U.S. Pat. No. 5,401,681 entitled "Method Of Forming A Bit Line Over Capacitor Array Of Memory Cells", listing Charles H. Dennison as an inventor, and which is now U.S. Pat. No. 5,401,681; which is a continuation-in-part of Ser. No. 047,668, Apr. 14, 1993, Pat. No. 5,338,700; which is a continuation-in-part of Ser. No. 017,067, Feb. 12, 1993, U.S. Pat. No. 5,340,763.

TECHNICAL FIELD

This invention relates generally to formation of a bit line over capacitor arrays of memory cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the word lines and bit lines. With non-buried bit line constructions, deep vertical contacts are made through a thick insulating layer to the cell FETs, with the capacitor constructions being provided over the word lines and beneath the bit lines. Such non-buried bit line constructions are also referred to as "capacitor-under-bit line" or "bit line-over-capacitor" constructions, and are the subject of this invention.

BRIEF DESCRIPTION OF THE DRAWINGS

Preferred embodiments of the invention are described below with reference to the following accompanying drawings.

FIG. 12 is a view of the FIG. 10 wafer taken at a step subsequent to that shown by FIG. 11.

DETAILED DESCRIPTION OF THE PREFERRED EMBODIMENTS

Figure 1:
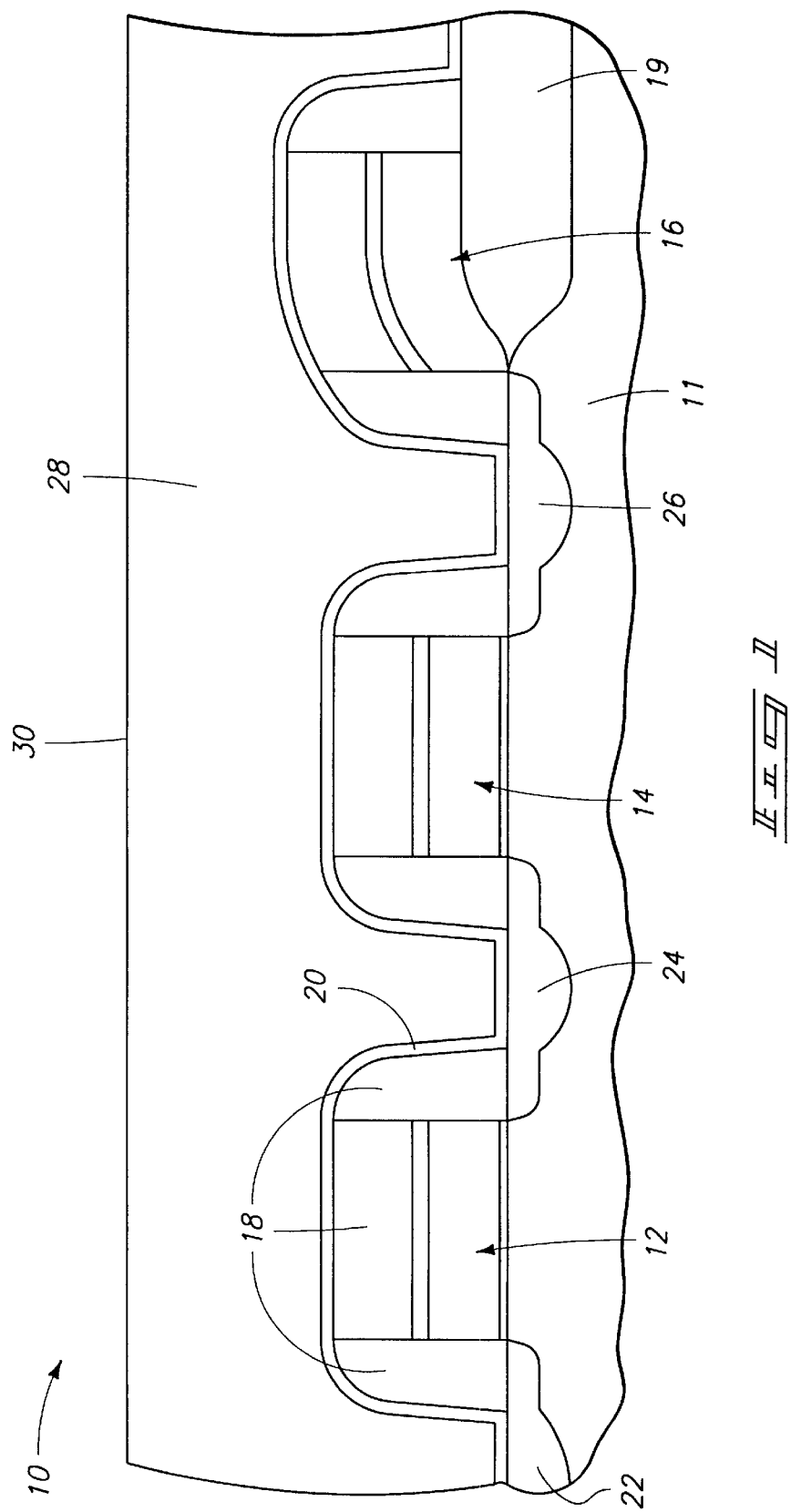
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a bit line over capacitor array of memory cells comprises the following steps:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a layer of electrically insulating material over the word lines and active regions, the layer of insulating material having an uppermost surface which is above the word lines;

providing first and second respective contact openings through the insulating material layer to the respective first and second active areas;

providing a first layer of electrically conductive material over the insulating material layer and within the first and second contact openings which electrically connects with the respective first and second active regions, the first layer being provided to a thickness which less than completely fills the first and second contact openings thereby leaving outwardly open first voids within the first and second contact openings;

providing a capacitor dielectric layer over the first layer and within the first voids of the first and second contact openings, the capacitor dielectric layer being provided to a thickness which less than completely fills the first voids thereby leaving outwardly open second voids within the first and second contact openings;

providing a second layer of electrically conductive material within the second voids of the first and second contact openings;

electrically isolating all electrically conductive material within the first contact openings from all electrically conductive material within the second contact openings;

providing a bit line insulating layer outwardly of the second layer of electrically conductive material;

patterning a bit contact opening through the bit line insulating layer to outwardly expose electrically conductive first layer material within the second contact openings; and providing a patterned bit line in electrical communication with the outwardly exposed electrically conductive first layer material within the second contact openings through the bit contact opening.

In accordance with another aspect of the invention, a semiconductor memory device comprises:

a semiconductor substrate;

a field effect transistor gate positioned outwardly of the semiconductor substrate;

opposing active areas formed within the semiconductor substrate on opposing sides of the gate;

a capacitor electrically connected with one of the active areas;

a bit line;

a dielectric insulating layer positioned intermediate the bit line and the other active area; and a bit line plug extending through the insulating layer and electrically interconnecting the bit line with the other active area, the bit line plug comprising an electrically conductive annular ring.

In accordance with yet another aspect of the invention, an integrated circuit comprises:

an active area formed relative to a semiconductor substrate;

an electrically conductive line;

a dielectric insulating layer positioned intermediate the electrically conductive line and the active area; and an interconnecting plug extending through the insulating layer and electrically interconnecting the line with the active area, the interconnecting plug comprising an electrically conductive annular ring.

These and other aspects of the invention will be appreciated from the following description and concluding claims.

Referring first to FIG. 1, a semiconductor wafer fragment is indicated generally by reference numeral 10. Wafer 10 is defined in part by a bulk silicon semiconductive substrate 11, and has been provided with an array of substantially electrically isolated word lines, such as the illustrated word lines 12, 14 and 16. Such word lines are of a conventional construction having a lowermost gate oxide, a lower polysilicon layer, an overlying silicide layer such as tungsten silicide, and insulating caps and side insulating spacers 18. Such spacers and caps 18 preferably comprise an insulative nitride, such as $Si_3N_4$. A thin layer 20 of $Si_3N_4$ is provided atop the wafer to function as a diffusion barrier. Layer 20 has a thickness which is preferably from about 100 Angstroms to about 250 Angstroms.

Active areas are provided about the word lines, such as active regions 22, 24 and 26, to define an array of memory cell FETs. The discussion proceeds with reference to a FET formed using word line 14, which would be provided with a capacitor construction for definition of a single memory cell. Active region 26 defines a first active region for electrical connection with a memory cell capacitor (described below). Active region 24 defines a second active region for electrical connection with a bit line (described below). Field oxide 19 is provided, as shown.

A first insulating material layer 28 is provided over the word lines and active areas. An example material is borophosphosilicate glass (BPSG), with an example deposition thickness being between 15,000 and 20,000 Angstroms. Preferably as shown, layer 28 is subsequently planarized by chemical-mechanical polishing (CMP) to an elevation of from about 2,000 Angstroms to about 8,000 Angstroms above the word line nitride caps 18 which are positioned adjacent the active areas, as opposed to the word lines which are over the field oxide. Such provides a planarized upper surface 30 which is elevationally above the word lines. Alternately, layer 28 could be unpolished at this point in the process.

Figure 2:
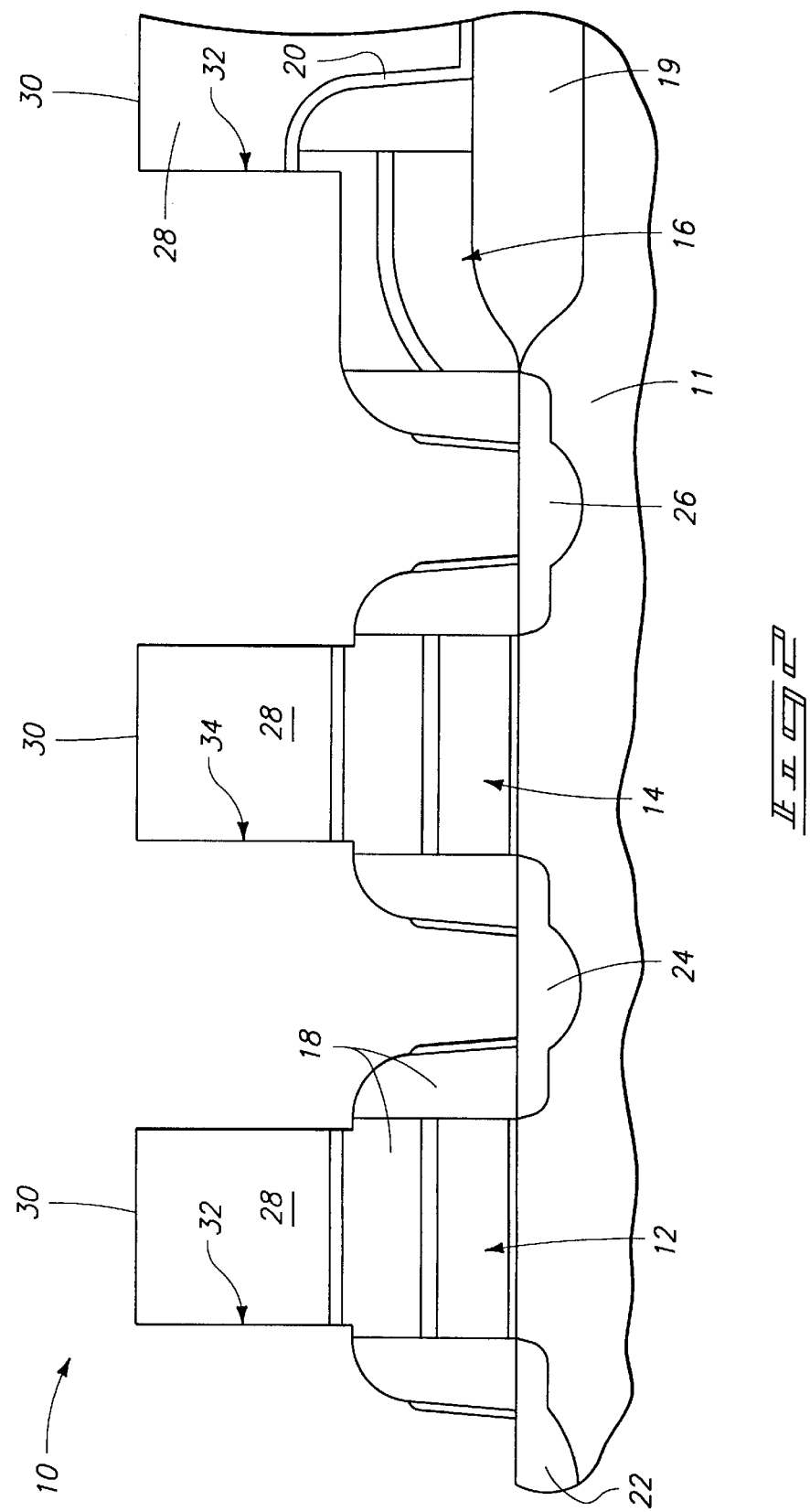
FIG. 2 is a view of the FIG. 1 wafer taken at a step subsequent to that shown by FIG. 1.

Referring to FIG. 2, a series of first contact openings 32 and second contact openings 34 are provided through first layer 28 to first and second active regions 26 and 24, respectively. Such would typically be formed by photomasking and dry chemical etching of BPSG selectively relative to nitride. An example etch chemistry would include $CHF_3$ and $O_2$ at low $O_2$ flow rate (i.e., less than 5% $O_2$ by volume in a $CHF_3/O_2$ mixture), or the combination of $CF_4$, Ar, $CH_2F_2$ and $CF_3$. Thereafter, an etch of the wafer is conducted to etch nitride layer 20 selectively relative to underlying silicon substrate 11 to upwardly expose active regions 26 and 24. An example etch chemistry would include a combination of $CHF_3$ and $CF_4$. The principal purpose of barrier layer 20 is to prevent diffusion of boron or phosphorus atoms from BPSG layer 28 into active areas 24 and 26. Caps 18 are preferably comprised of nitride ($Si_3N_4$) and layer 28 comprised of oxide, such that the contact etch to produce first contacts 32 and 34 will stop relative to word line spacers and caps 18.

Figure 3:
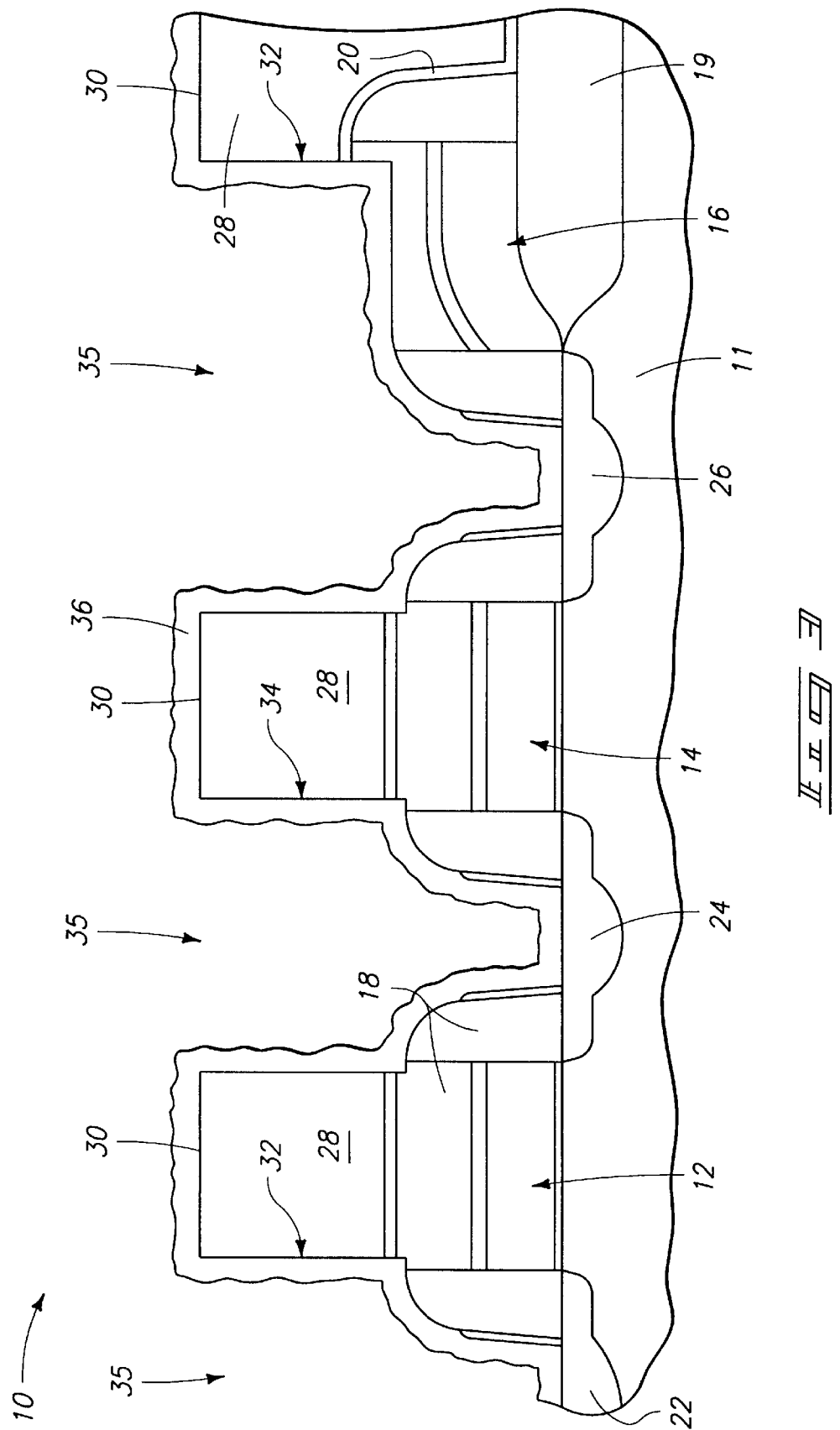
FIG. 3 is a view of the FIG. 1 wafer taken at a step subsequent to that shown by FIG. 2.

Referring to FIG. 3, a first layer 36 of electrically conductive material is provided over insulating material layer 28 to within first contact opening 32 and second contact opening 34 to electrically connect with first and second active regions 26 and 24, respectively. First layer 36 is deposited to a thickness which less than completely fills first contact opening 32 and second contact opening 34, thereby leaving outwardly open first voids 35 within the first and second contact openings. An example diameter for first contact opening 32 is 0.6 micron, while example dimension for second contact opening 34 are 0.6×1.0 micron. In such instance, an example preferred thickness for layer 36 is 1000 Angstroms. An example and preferred material for layer 36 is hemispherical grain (HSG) polysilicon. Such can be provided by first depositing a 600. Angstroms thick in situ doped polysilicon layer, followed by deposition of undoped HSG poly. Subsequent heating inherent in wafer processing will effectively conductively dope the overlying HSG poly layer. Alternately, layer 36 can be provided by in situ arsenic doping of an entire HSG layer.

Figure 4:
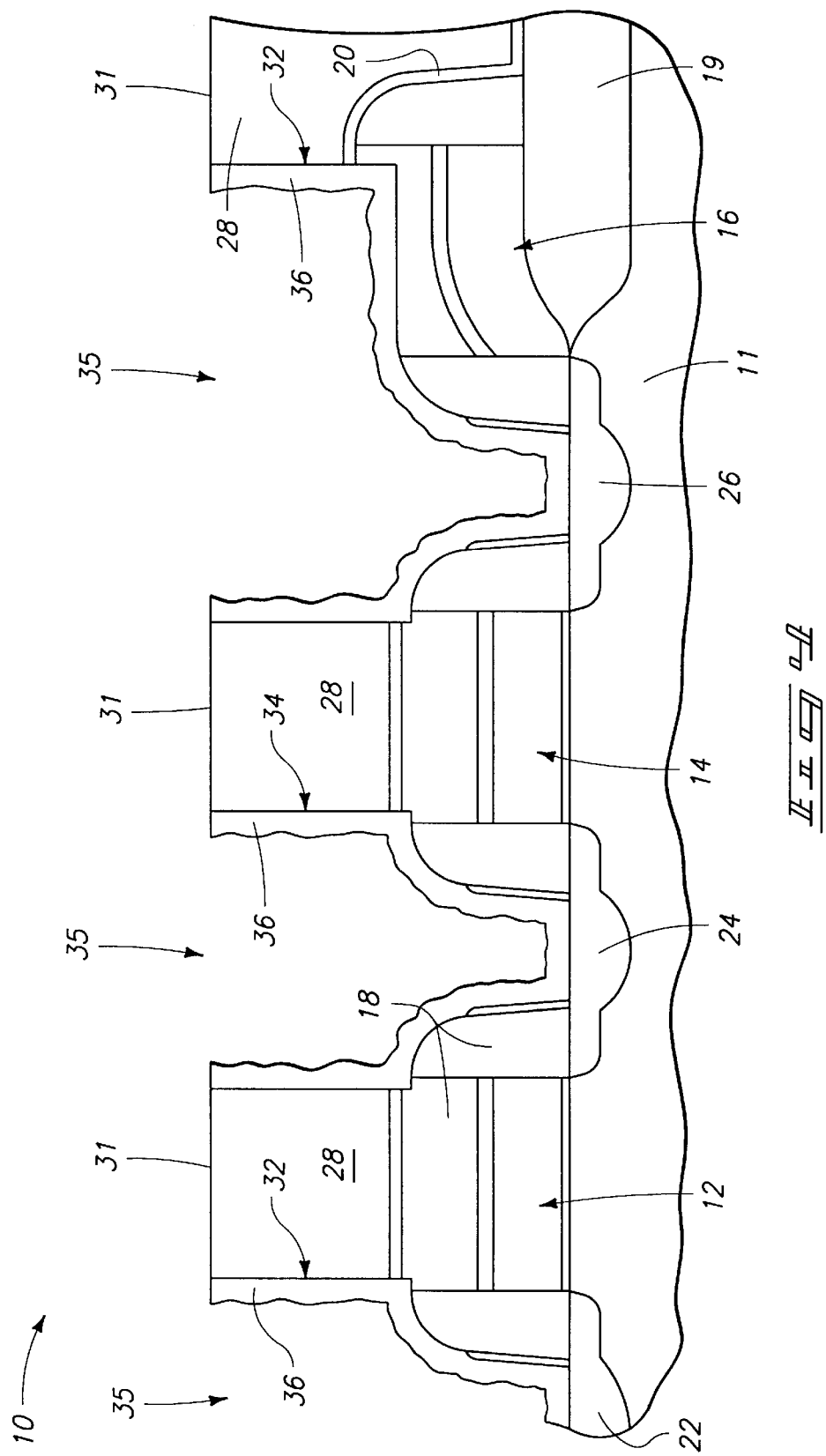
FIG. 4 is a view of the FIG. 1 wafer taken at a step subsequent to that shown by FIG. 3.

Referring to FIG. 4, wafer fragment 10 is planarized etched downwardly at least to former upper surface 30 (not shown) of insulating material 28 to remove conductive material 36 thereabove. This will isolate first layer conductive material 36 within first contact openings 32 from first layer conductive material 36 within second contact openings 34. Such planarized etching can be conducted by photoresist deposition and etchback, or by chemical-mechanical polishing. As shown, such planarized etching is conducted to a location which is slightly below former outer insulating layer 30, which in FIG. 4 is now designated with numeral 31.

Figure 5:
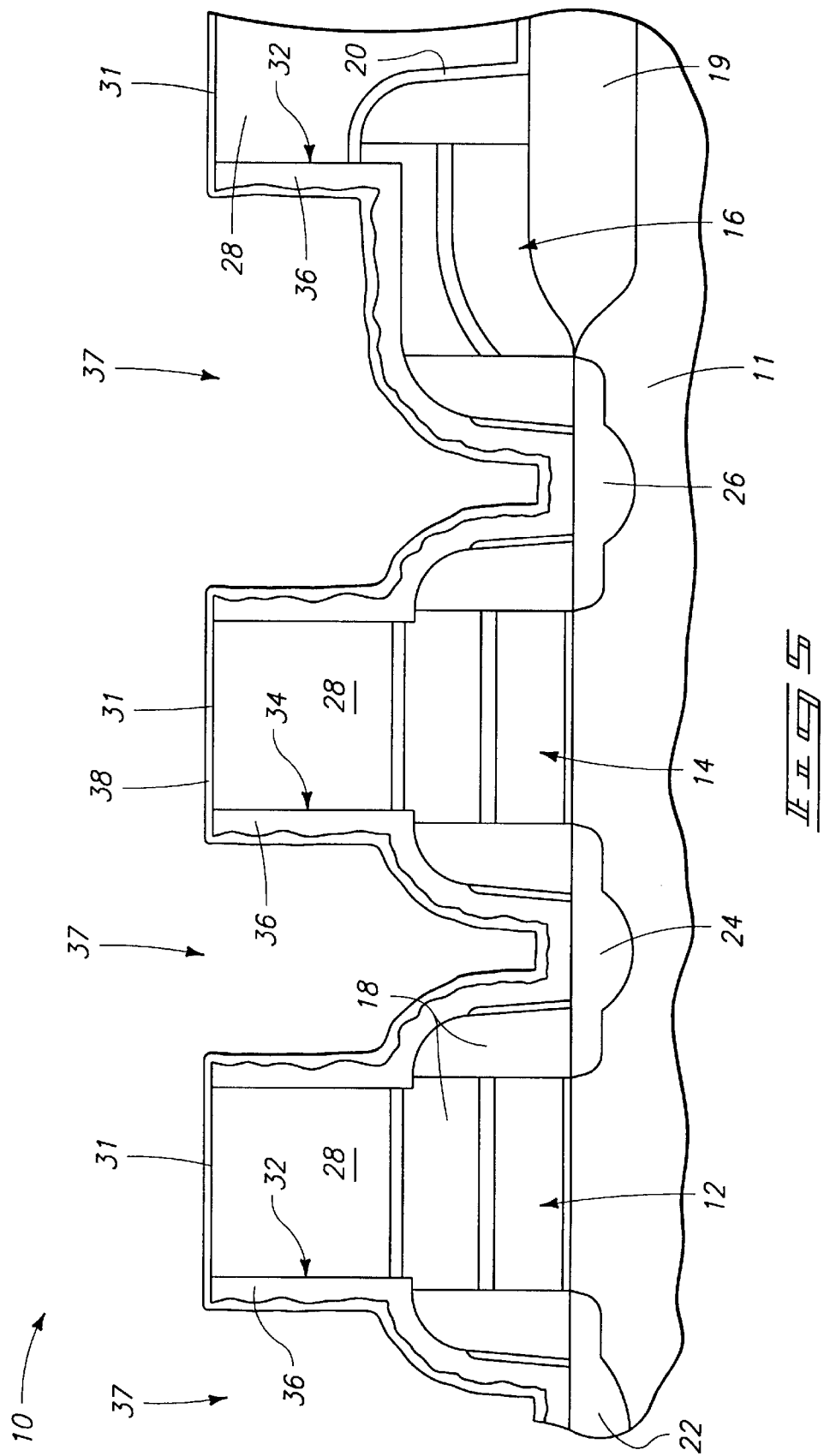
FIG. 5 is a view of the FIG. 1 wafer taken at a step subsequent to that shown by FIG. 4.

Referring to FIG. 5, a capacitor dielectric layer 38 is provided over patterned first conductive layer 36 and within first voids 35 of first contact openings 32 and second contact openings 34. Capacitor dielectric layer 38 is provided to a thickness which less than completely fills first voids 35, thereby leaving outwardly open second voids 37 within the first and second contact openings. Layer 38 preferably comprises an oxide-nitride-oxide (ONO) cell dielectric, with an example preferred total deposition thickness being 80 Angstroms. Other materials, such as $T_2O_5$ or barium strontium titanate, are also of course possible. Thus in this preferred described embodiment, the planarized etching step which isolates first conductive material layer 36 relative to the first and second contact openings is conducted prior to the step of providing capacitor dielectric layer 38.

Figure 6:
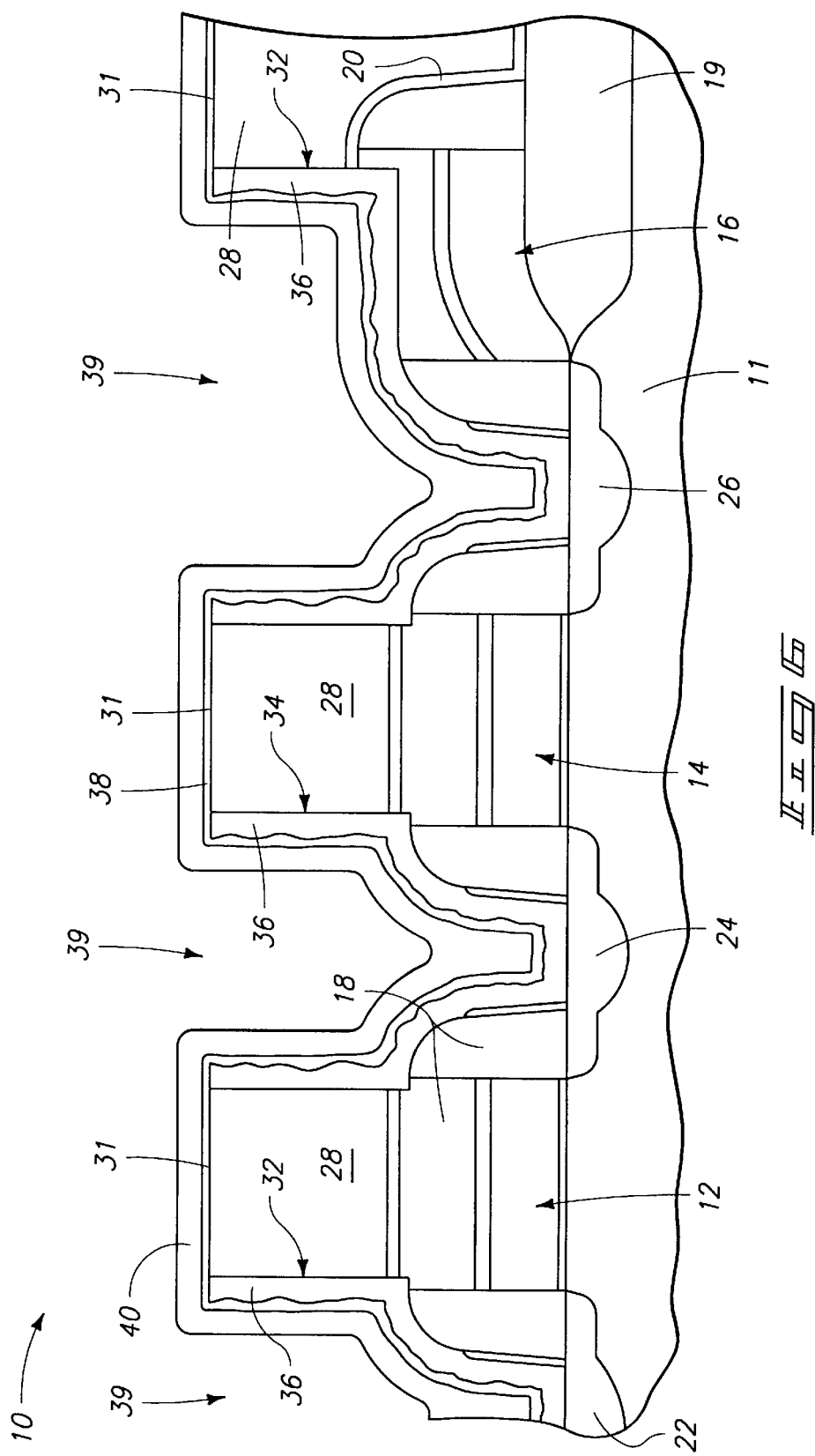
FIG. 6 is a view of the FIG. 1 wafer taken at a step subsequent to that shown by FIG. 5.

Referring to FIG. 6, a second layer 40 of electrically conductive material (preferably polysilicon) is provided within second voids 37 of the first and second contact openings to a thickness which less than completely fills the voids, thereby leaving outwardly open third voids 39 within the first and second contact openings.

Figure 7:
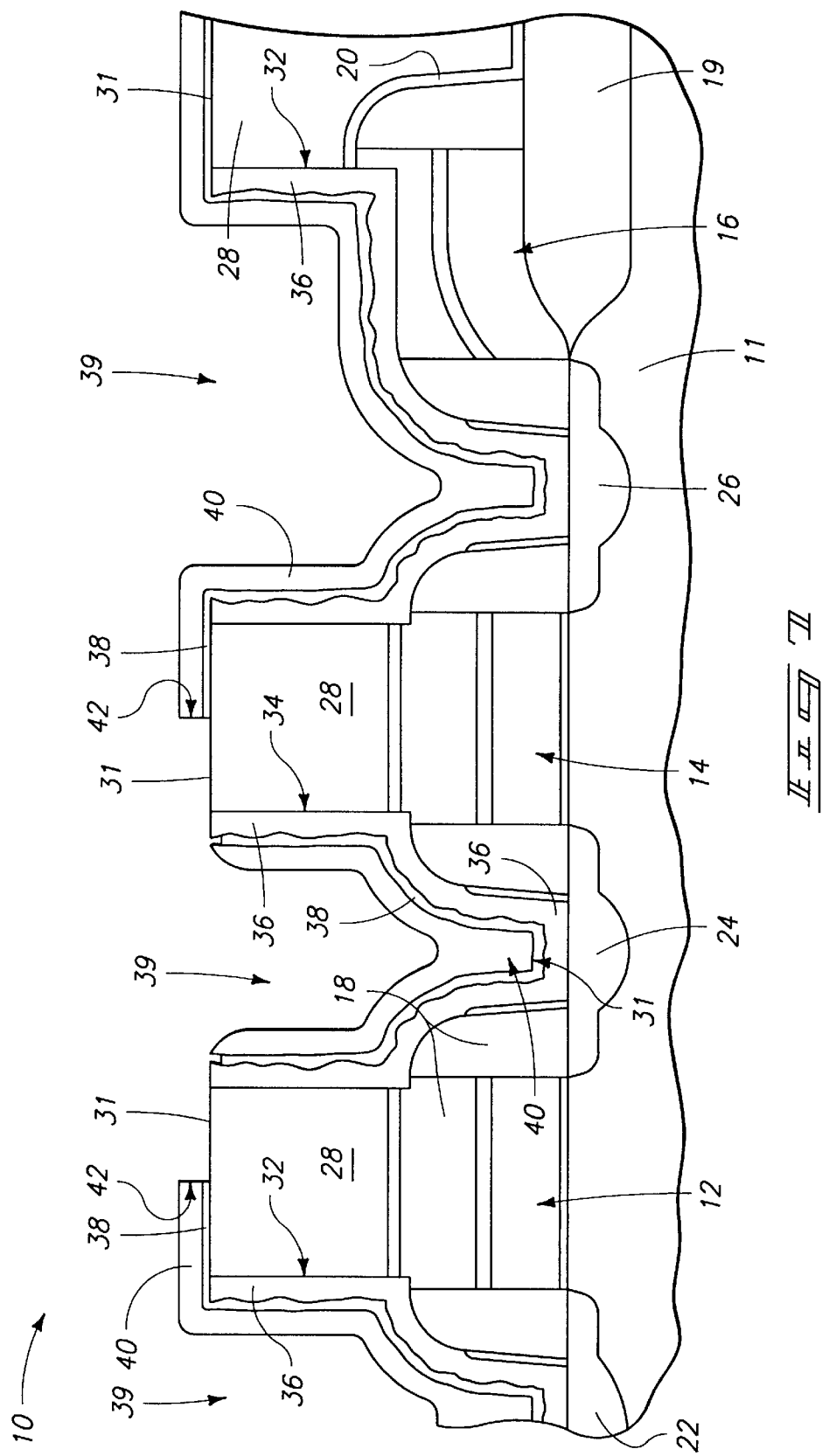
FIG. 7 is a view of the FIG. 1 wafer taken at a step subsequent to that shown by FIG. 6.

Referring to FIG. 7, cell polysilicon layer 40 and underlying cell dielectric layer 38 are patterned and etched to define the desired configuration of cell poly layer 40 for capacitor and interconnecting line construction, and to outwardly expose first electrically conductive material layer 36 within second contact opening 34. This effectively defines a contact opening 42 which is larger than and encapsulates all of second contact opening 34. Thus, all electrically conductive material within first contact openings 32 is electrically isolated from ohmic contact from all electrically conducted material within second contact openings 34. The FIG. 7 etch is conducted to etch polysilicon selectively relative to oxide initially, followed by etching of the oxide/nitride oxide selectively relative to polysilicon. Modification of the upper profile of layers 36, 38 and 40 at the top of second contact opening 34 will be produced as shown.

Figure 8:
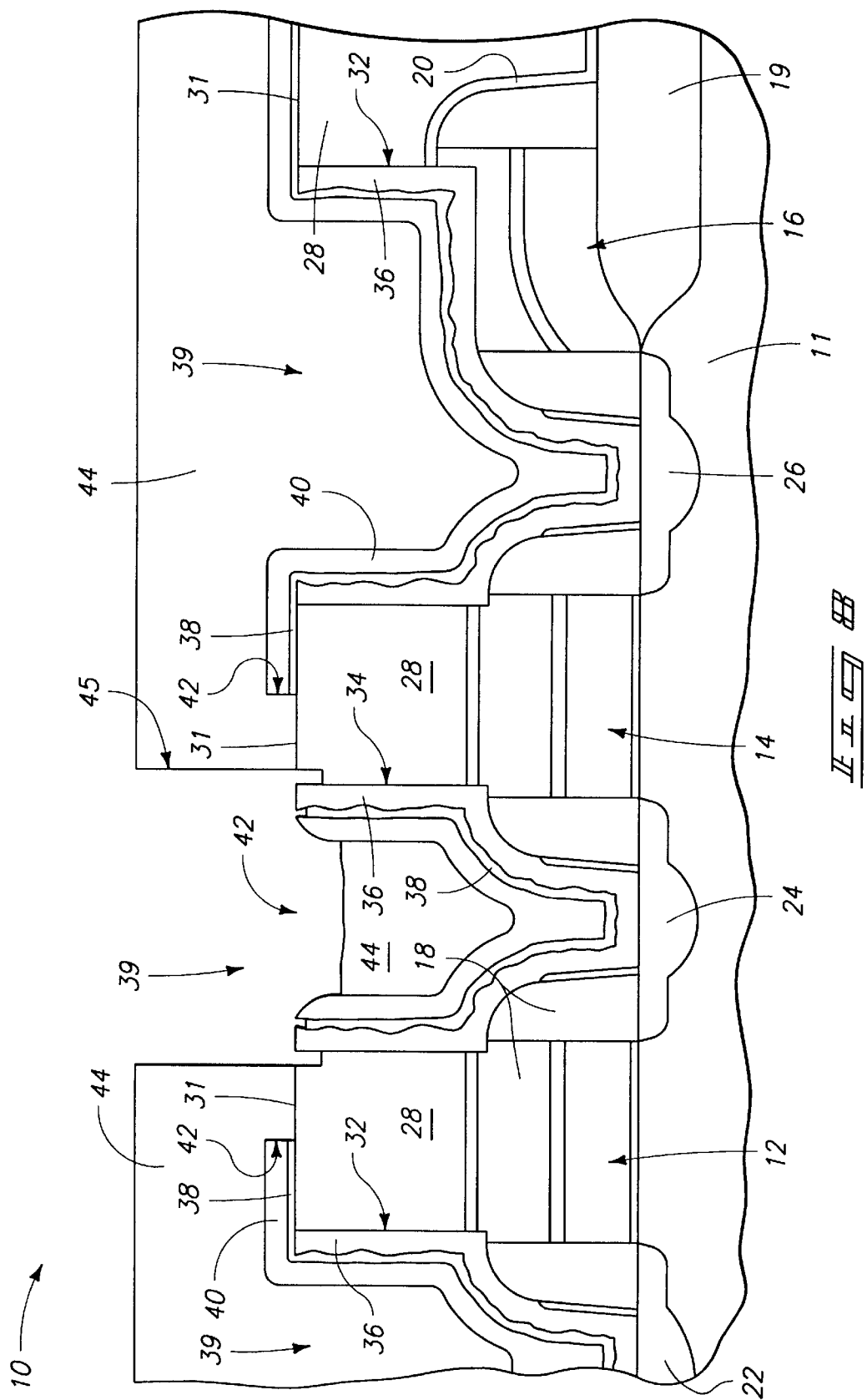
FIG. 8 is a view of the FIG. 1 wafer taken at a step subsequent to that shown by FIG. 7.

Referring to FIG. 8, a bit line insulating layer 44 (e.g., BPSG) is provided outwardly of second electrically conductive material layer 40 and to within third voids 39. A bit contact opening 45 is patterned through bit line insulating layer 40 to again outwardly expose electrically conductive first layer material 36 within second contact opening 34.

Figure 9:
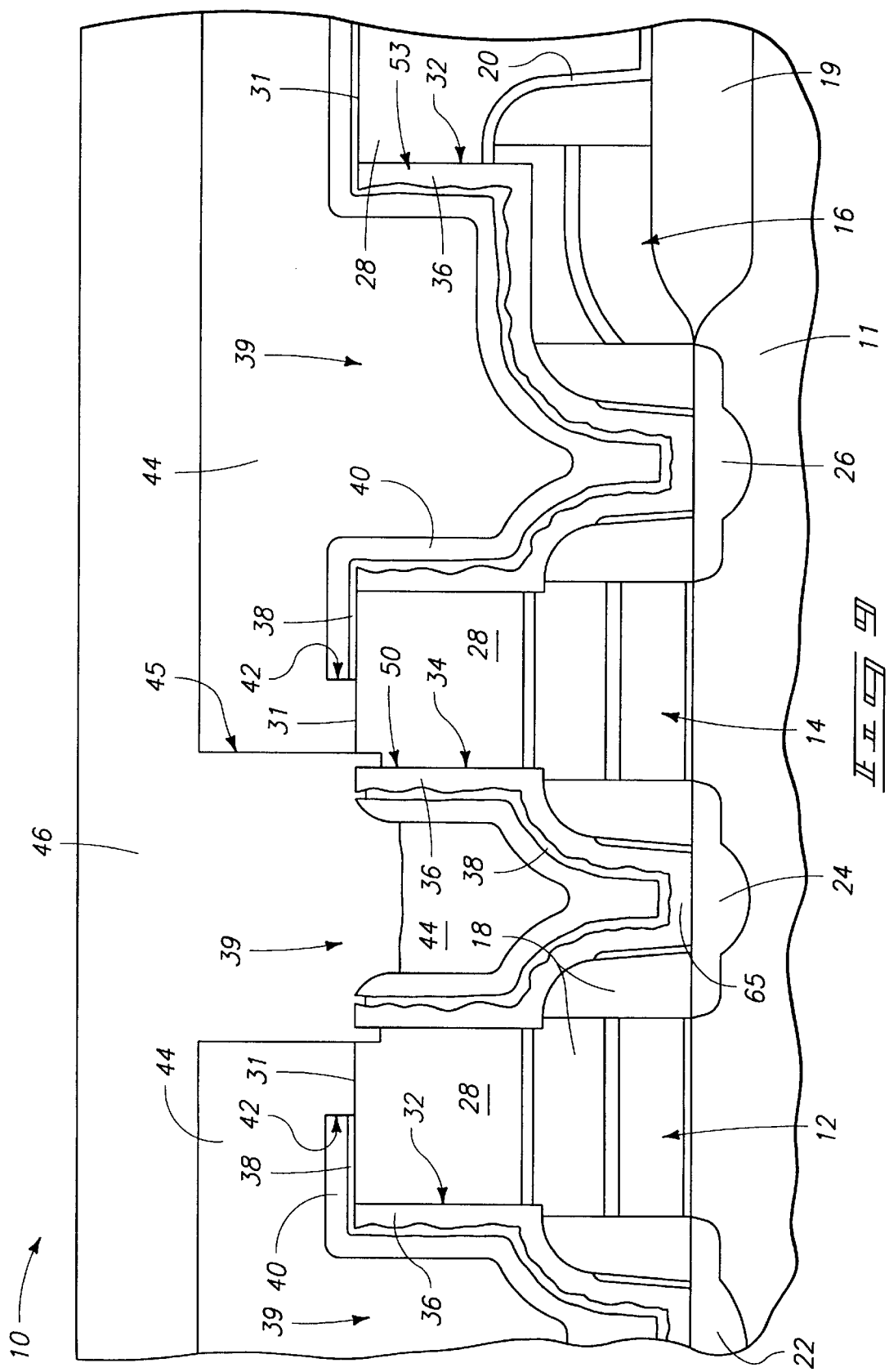
FIG. 9 is a view of the FIG. 1 wafer taken at a step subsequent to that shown by FIG. 8.

Referring to FIG. 9, a patterned bit line 46 is provided in electrical communication with the outwardly exposed electrically conductive first material layer 36 within second contact opening 34 through bit contact opening 45.

Figure 10:
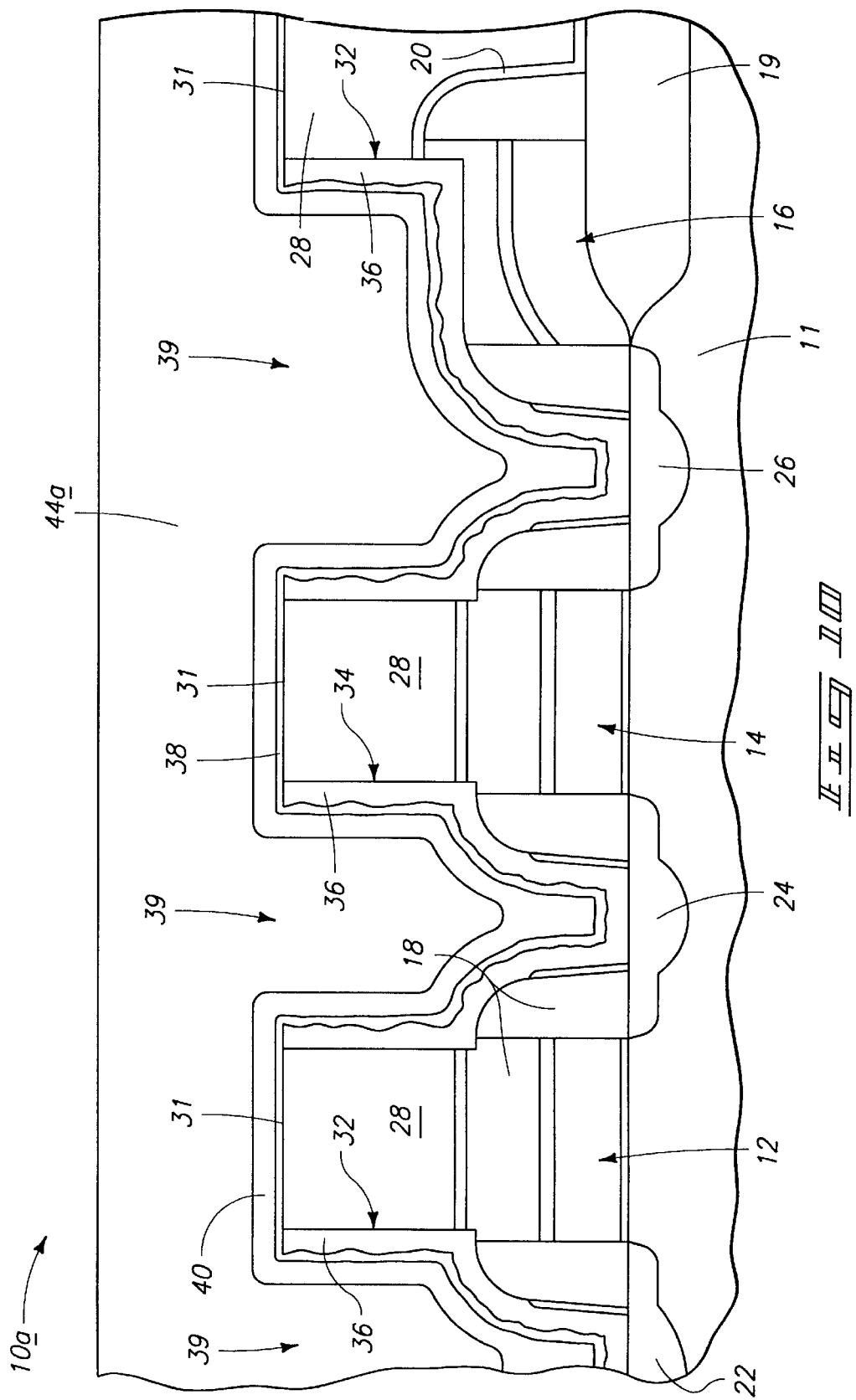
FIG. 10 is a diagrammatic sectional view of an alternate embodiment semiconductor wafer fragment at one alternate processing step in accordance with the invention.

The above described process etches capacitor dielectric layer 38 and second conductive layer 40 away from over second contact opening 34 prior to provision of bit line insulating layer 44. An alternate process wherein such etching is conducted after provision of bit line insulating layer 44 is described with reference to FIGS. 10–14. FIG. 10 illustrates the FIG. 6 wafer at a processing step immediately subsequent to FIG. 6 which differs from that shown in FIG. 7. Like numbers are utilized from the first described embodiment where appropriate, with significant differences being indicated by addition of a suffix "a" to the FIGS. 10–14 embodiment. FIG. 10 shows fragment 10a having bit line insulating layer 44a deposited atop previously unpatterned layers 40 and 38.

Figure 11:
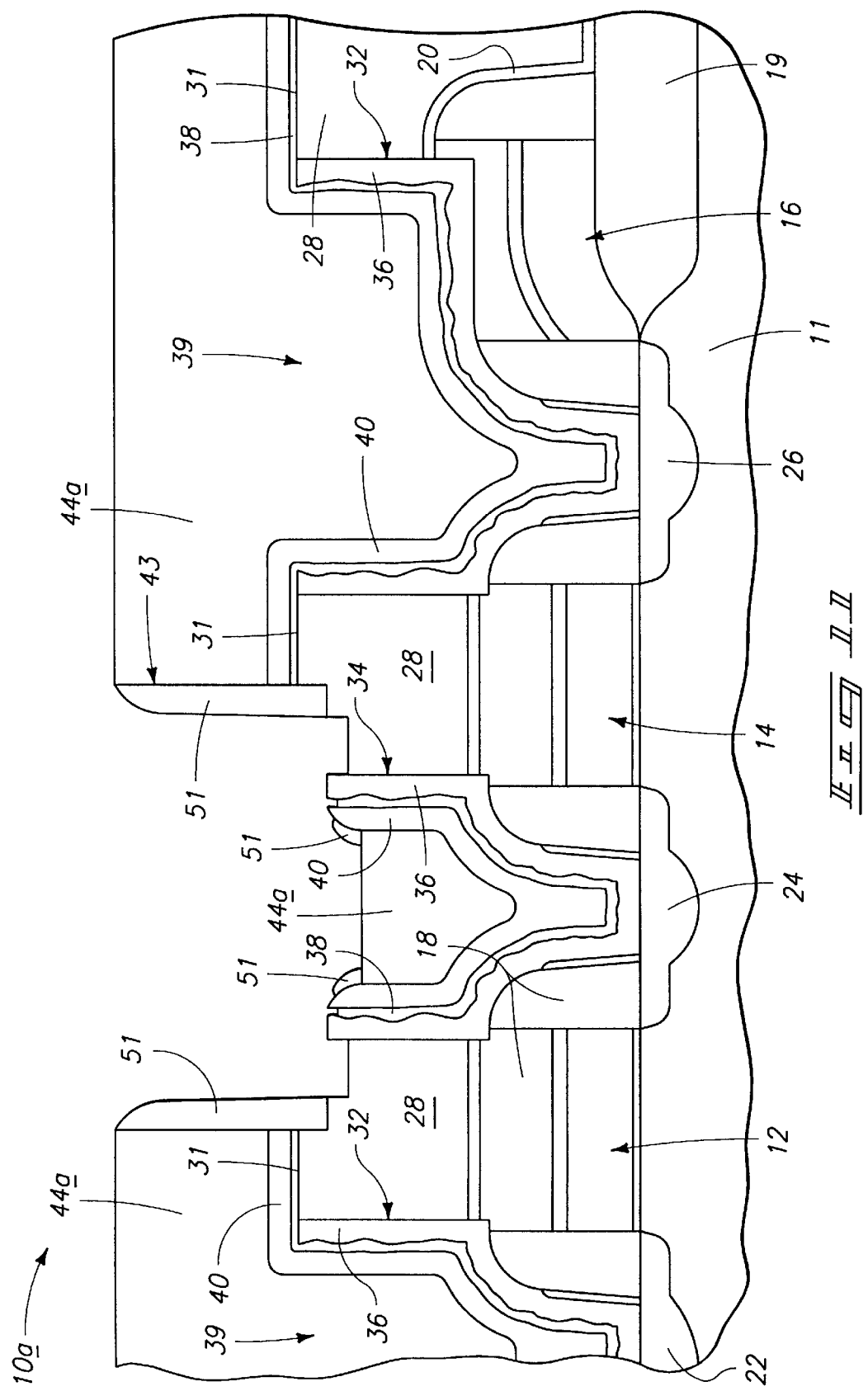
FIG. 11 is a view of the FIG. 10 wafer taken at a step subsequent to that shown by FIG. 10.
Figure 11:
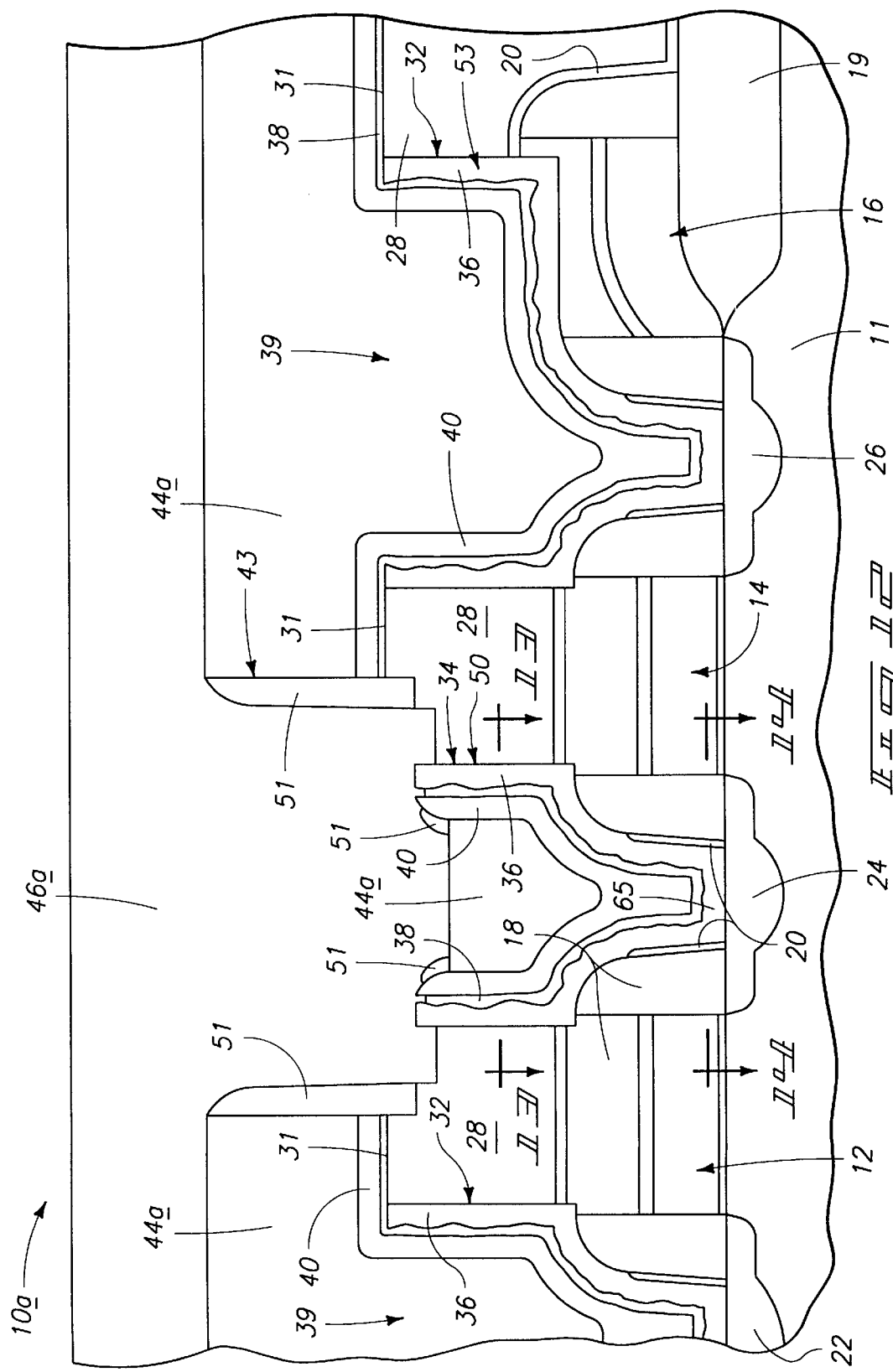
Figure 13:
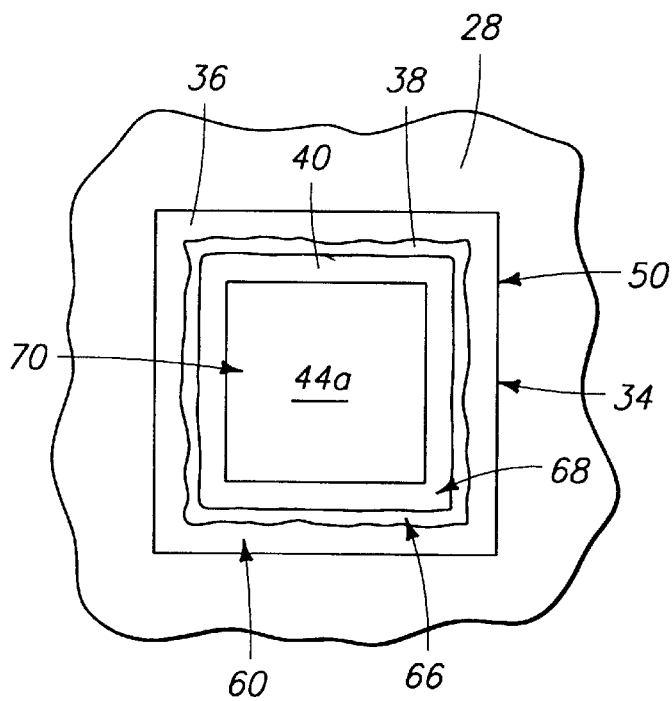
FIG. 13 is a diagrammatic sectional view taken through line 13—13 in FIG. 12.
Figure 14:
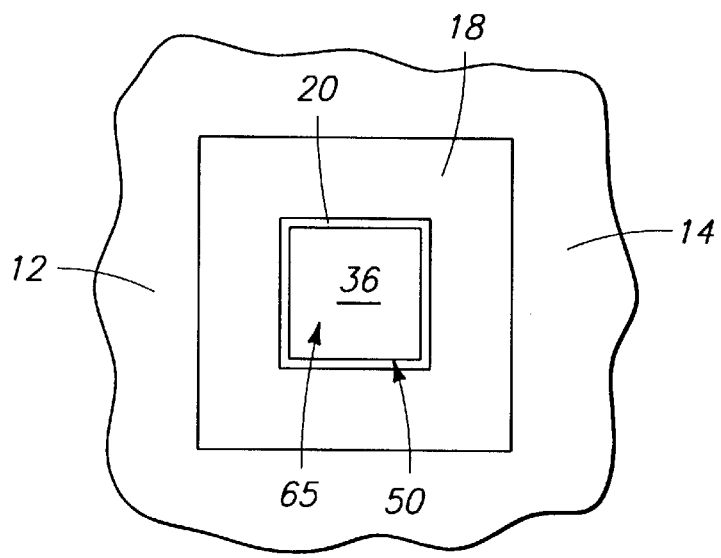
FIG. 14 is a diagrammatic sectional view taken through line 14–14 in FIG. 12.

Referring to FIG. 11, layer 44a is patterned and etched to provide a bit contact opening 43 over plugged second contact opening 34. A dielectric film is deposited and anisotropically etched to provide sidewall spacers 51. Referring to FIGS. 12–14, a patterned bit line layer 46a is provided. Spacers 51 electrically isolate film 40 within contact opening 32 from patterned bit line later 46a.

The FIGS. 10–14 process in comparison with the first described embodiment, while having the advantage of reduced masking steps, does have the disadvantage of providing greater parasitic capacitance between the bit line plugging material within contact opening 43 the result of closer proximity of such material to second cell poly layer 40 than in the first described embodiment.

Regardless of the above techniques, the process results in definition of a bit line plug 50 (FIGS. 9, 12 and 13) within second contact opening 34, and a novel semiconductor memory device. Such is comprised, by way of example, of field effect transistor gate 14 and opposing active areas 24 and 26 (FIGS. 9 and 12). A capacitor 53 electrically connects with the one active area 26. A bit line 46/46a electrically connects with the other active area 24 through bit line plug 50, which extends through intermediate dielectric insulating layer 44/44a. Referring principally to FIG. 13, bit plug 50 comprises an electrically conductive annular ring 60 which is defined or formed of conductive material layer 36 within second contact opening 34. Bit line plug 50 comprises a non-annular solid mass bass plug 65 (FIGS. 9, 12 and 14) which electrically connects with active area 24. Electrically conductive annular ring 60 is integral with and extends outwardly of base plug 65 the result of both constituting or resulting from conductive layer 36 deposition.

Layer 38 material comprises an electrically insulating annular ring 66 (FIG. 13) which is positioned radially inward of electrically conductive annular ring 60. Likewise, layer 40 comprises an inner electrically conductive annular ring 68 (FIG. 13) positioned radially inward of electrically insulating annular ring 66. Finally, material 44a comprises a non-annular substantially solid mass inner electrically insulating plug 70 (FIG. 13) which is provided radially inward of inner electrically conductive annular ring 68.

Accordingly in the above-described preferred embodiments, electrically conductive annular ring 60 is that portion of bit plug 50 which effectively provides electrical communication between active area 24 and bit line 46/46a. Conductive material 40 of inner electrically conductive annular ring 68 is isolated from ohmic electric connection with ring 60 the result of intervening dielectric layer 38. Despite the reduced contact area the outer portion of a bit line plug, resistive loss of the poly has been calculated to be less than 600 ohms.

Although the immediately above-described construction was relative to a semiconductor memory device, aspects of the invention are believed to have application to other integrated circuit art areas having active areas formed relative to a semiconductor substrate where electrical connection is desired to an elevationally higher electrically conductive line. Aspects of the construction are also believed to be applicable to other integrated circuitry where elevationally inner and outer discrete electrically conductive nodes are desired to be interconnected in ohmic electrical connection. Accordingly, the invention is intended to be limited only by the accompanying claims appropriately interpreted in accordance with the doctrine of equivalents.

The above-described process in contradistinction to the parent application and patent eliminates the need for a poly plug process, saves one or more masking steps, and results in the elimination of two deposition and two etches.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a bit line over capacitor array of memory cells comprising the following steps:

forming an array of substantially electrically isolated word lines atop a semiconductor wafer;

forming active regions about the word lines, the active regions including a first active region and a second active region;

forming a layer of electrically insulating material over the word lines and active regions;

forming first and second respective contact openings through the insulating material layer to the respective first and second active regions;

forming a first layer of electrically conductive material over the insulating material layer and within the first and second contact openings which electrically connects with the respective first and second active regions, the first layer being provided to a thickness which less than completely fills the first and second contact openings thereby leaving outwardly open first voids within the first and second contact openings;

forming a capacitor dielectric layer over the first layer and within the first voids of the first and second contact openings, the capacitor dielectric layer being provided to a thickness which less than completely fills the first voids thereby leaving outwardly open second voids within the first and second contact openings;

forming a second layer annular ring of electrically conductive material within the second voids of the first and second contact openings; and forming a patterned bit line in electrical communication with the conductive first layer material within the second contact openings.

2. The method of claim 1 further comprising electrically isolating all electrically conductive material within the first contact openings from all electrically conductive material within the second contact openings.

3. The method of claim 1 further comprising:

electrically isolating all electrically conductive material within the first contact openings from all electrically conductive material within the second contact openings;

forming a bit line insulating layer outwardly of the second layer annular ring of electrically conductive material; and patterning a bit contact opening through the bit line insulating layer to outwardly expose electrically conductive first layer material within the second contact openings.

4. A method of forming a bit line contact to an active region comprising the following steps:

forming a layer of electrically insulating material over the active region;

forming a contact opening through the insulating material layer to the active region;

forming a first layer of electrically conductive material within the contact opening, the first layer being provided to a thickness which less than completely fills the contact opening thereby leaving an outwardly open first void within the contact opening;

forming a dielectric layer over the first layer and within the first void the dielectric layer being provided to a thickness which less than completely fills the first void thereby leaving an outwardly open second void within the contact opening;

forming a second layer of electrically conductive material within the second void, the second layer of electrically conductive material being formed to less than completely fill the second void thereby leaving an outwardly open third void within the contact opening;

forming electrically insulating material within the third void; and forming a patterned bit line in electrical communication with the electrically conductive first layer material within the contact opening.

5. The method of claim 4 further comprising planarize etching the first conductive material layer downwardly to at least the upper surface of the insulating material layer.

6. A method of forming an interconnecting plug between a first electrically conductive node and second electrically conductive node, the second electrically conductive node being elevationally higher than the first electrically conductive node, the method comprising the following steps:

forming a first layer of electrically conductive material in contact with a first electrically conductive node, the first layer defining a first layer void which opens upwardly;

forming a dielectric layer within the first layer void, the dielectric layer defining a dielectric layer void which opens upwardly;

forming a second layer annular ring of electrically conductive material within the dielectric layer void; and forming a second electrically conductive node in contact with the electrically conductive first layer material.

7. The method of claim 6 wherein the second layer annular ring of electrically conductive material defines a second layer void which opens upwardly, and further comprising forming a non-annular substantially solid mass within the second layer void.

8. A method of forming an interconnecting plug between a first node and bit line, the bit line being elevationally higher than the first node, the method comprising the following steps:

forming a layer of electrically conductive material over a first node, the electrically conductive material defining a void which opens upwardly;

forming a non-annular substantially solid mass of insulative material within the void;

forming a bit line in contact within the non-annular mass and in contact with the layer of electrically conductive material.

9. A method of forming an interconnecting plug between a first node and bit line, the bit line being elevationally higher than the first node, the method comprising the following steps:

forming a first layer of electrically conductive material over a first node, the first layer defining a first layer void which opens upwardly;

forming a dielectric layer within the upward opening first layer void, the dielectric layer defining a dielectric layer void which opens upwardly;

forming a second layer annular ring of electrically conductive material within the dielectric layer void; and forming a bit line in contact within the first and second conductive layers.

* * * * *

UNITED STATES PATENT AND TRADEMARK OFFICE
CERTIFICATE OF CORRECTION

PATENT NO. : 5,821,140
DATED : October 13, 1998
INVENTOR(S) : Mark Jost; Charles H. Dennison; Kunal Parekh It is certified that error appears in the above-indentified patent and that said Letters Patent is hereby corrected as shown below:

Col. 4, l. 26: Replace "$CF_3$" with --$CHF_3$--.

Col. 4, l. 46: Replace "dimension" with --dimensions--.

Col. 4, l. 51: Delete the "." after "600".

Col. 5, l. 67: Replace "later" with --layer--.

Signed and Sealed this

Twenty-sixth Day of October, 1999

Attest:

Q. TODD DICKINSON

Attesting Officer     Acting Commissioner of Patents and Trademarks